United States Patent [19]
Granot

[11] Patent Number: 4,891,595
[45] Date of Patent: Jan. 2, 1990

[54] RESTRICTED VOLUME IMAGING

[75] Inventor: Joseph Granot, Holon, Israel

[73] Assignee: Elscint Ltd., Haifa, Israel

[21] Appl. No.: 53,484

[22] Filed: May 26, 1987

[30] Foreign Application Priority Data

Jun. 10, 1986 [IL]  Israel .................................. 79076

[51] Int. Cl.⁴ .......................................... G01R 33/20
[52] U.S. Cl. ................................... 324/309; 324/307
[58] Field of Search ................. 128/653; 324/300, 307, 324/309, 311, 312, 314

[56] References Cited

U.S. PATENT DOCUMENTS

| 4,480,228 | 10/1984 | Bottomley | 324/309 |
| 4,510,449 | 4/1985 | Ernst | 324/309 |
| 4,520,828 | 6/1985 | Barl et al. | 324/309 |
| 4,532,473 | 7/1985 | Wehrli | 324/309 |
| 4,551,680 | 11/1985 | Macovski | 324/309 |
| 4,563,647 | 1/1986 | Young | 324/309 |
| 4,587,488 | 5/1986 | Young | 324/309 |
| 4,647,858 | 3/1987 | Bottomley | 324/320 |
| 4,684,892 | 8/1987 | Graumann | 324/309 |
| 4,698,592 | 10/1987 | Feinberg | 324/309 |

OTHER PUBLICATIONS

P. C. Lauterbur, "Image Formation by Induced Local Interactions: Examples Employing Nuclear Magnetic Resonance", Nature, vol. 242, pp. 190–191, 3/16/73.
Gordon et al., "Volume Selection for High Resolution NMR Studies", pp. 272–273.
W. P. Aue et al., "Volume-Selective Excitation. A Novel Approach to Topical NMR", Journal of Magnetic Resonance 56, pp. 350–354 (1984).
Article by J. Frahm et al., "Stimulated Echo Imaging", Journal of Magnetic Resonance, vol. 64, pp. 81–93 (1985).
Article by A. H. Hahn, entitled, "Spin Echoes", Physical Review, vol. 80, No. 4, Nov. 15, 1950.

Primary Examiner—Michael J. Tokar
Attorney, Agent, or Firm—Sandler & Greenblum

[57] ABSTRACT

A method of using a stimulated echo sequence for acquiring imaging data of spatially localized volumes with a magnetic resonance system.

20 Claims, 2 Drawing Sheets

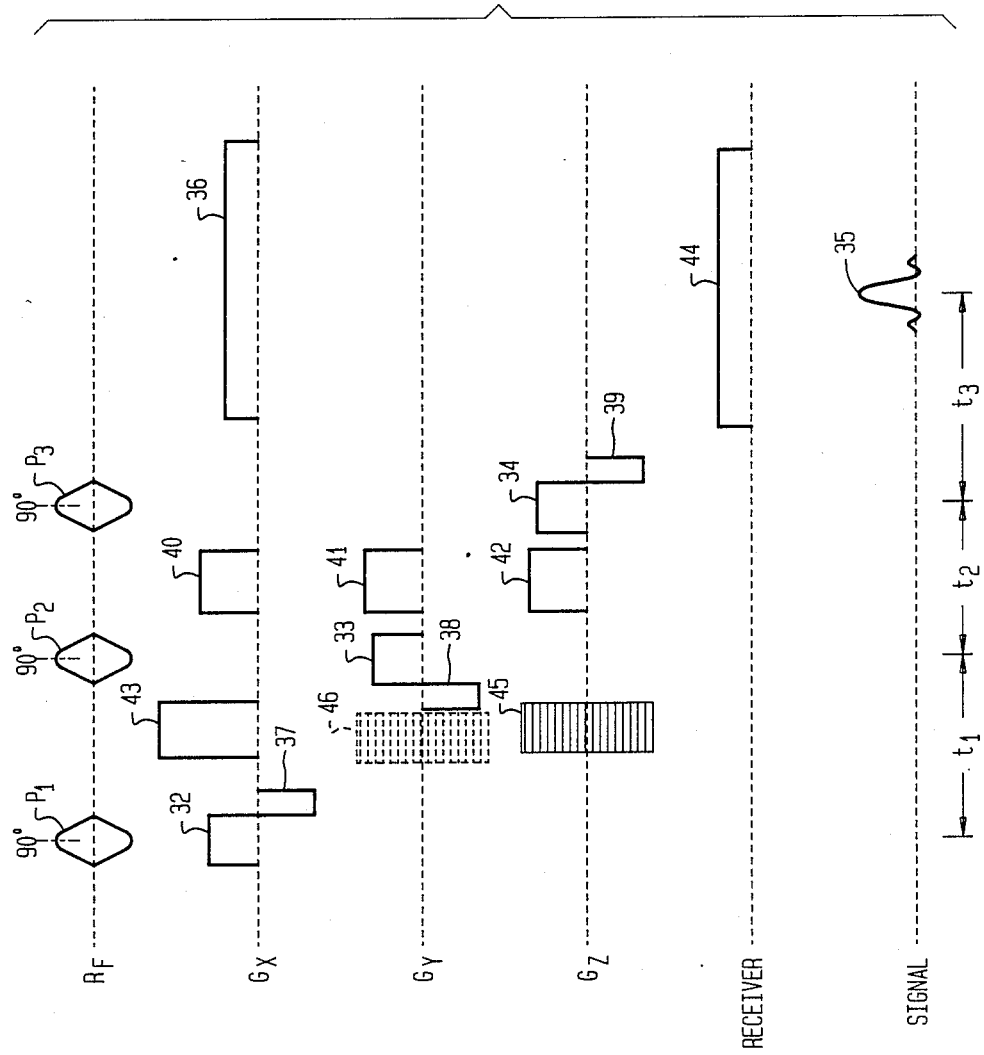

RESTRICTED VOLUME IMAGING

FIELD OF THE INVENTION

This invention relates to nuclear magnetic resonance imaging (MRI) and more particularly to methods for spatially restricting the volume of interest for MRI. A related application by the inventor herein is the patent application first filed in the United States on Mar. 20, 1987, which received Ser. No. 028204. Another related application is the patent application first filed in the United States on Sept. 20th, 1984 which received Ser. No. 652,462. Both patent applications are assigned to the assignee of this invention.

BACKGROUND OF THE INVENTION

Nuclear magnetic resonance (NMR) chemical shift spectroscopy has been in use for a relatively long time. For example, in 1950 E. L. Hahn published an article in the Physical Review, Volume 80, pp 580 which disclosed a sequence to obtain stimulated echo signals (STE) for use in spectroscopic experiments. In 1973 P. C. Lauterbur in an article published in Nature (London) 242, 89/90 disclosed the use of field gradients for determining the source location of free induction decay (FID) signals obtained in NMR experiments. The knowledge of the source of the FID signals enables the MR acquired data to be used to reconstruct interior images of the subject placed in a strong magnetic field.

It has long been known that when atomic nuclei that have net magnetic moments are placed in a strong static magnetic field, the nuclei ("spins") precess about the axis of the field at the Larmor frequency given by the equation:

$$f = \gamma Bo/2\pi$$

in which:
$\gamma$ is a gyromagnetic ratio, constant for each NMR isotope which exhibits a net magnetic moment;
Bo is the strength of the magnetic field; and
$\pi$ is the well known constant 3.1416+.

As is well known magnetic resonance imaging (MRI) uses a relatively strong static magnetic field having a given direction which is aligned with the Z axis of a cartesian coordinate system. The strong static magnetic field causes the nuclei of certain elements such as hydrogen to align with the field. Subsequently radio frequency pulses of sufficient amplitude and/or time duration are applied to perturb or nutate the aligned nuclei. The rotational frequency of the RF precession and the frequency of the RF pulse is the above noted Larmor frequency.

After the termination of the RF pulse the rotated nuclei or spins tend to realign with the static magnetic field. The precession of the transverse component in the magnetic field generates RF signals also having a Larmor frequency. These signals are known as free induction decay (FID) signals. It is these signals that are received to provide information on the spin density of the element whose spins have been rotated by the RF pulse.

There are many different methods used for obtaining the FID signals. Among the methods and probably one of the most popular methods at the present time is the spin echo method. This method is well known and will not be elaborated on herein.

In imaging, in general, the scientists are always endeavoring to increase the spatial resolution and lower the time required to provide the image. These are contrary aims; that is decreasing the time generally may require decreasing the resolution and generally will adversely effect the signal to noise ratio. Thus, a method for decreasing the time while maintaining the same resolution an/or signal to noise ratio or a method for increasing the resolution while imaging during the same time period is highly desirable. In MR imaging, increasing the time of acquiring an image does not pose any known danger to the patient because there is no dangerous radiation being used; nonetheless, since patient comfort and throughput are important considerations effecting both the picture quality and the economics of the system, clincians and imaging scientists are always interested in decreasing the time required for acquiring images. In some cases the time saved might be used for accumulating several images of the same slice and subsequently averaging the several images to improve the signal-to-noise ratio.

A further goal desired by imaging scientists is to be able to zoom during the acquisition stage. In other words, during the imaging process if a particular portion of the body shows an interesting manifestation; it is often desirable to zoom in on this manifestation and to thereby focus on the manifestation to the exclusion of other data. This is presently generally accomplished to MRI systems as a computer step after the acquisition of the data, especially if the imaging is to be accomplished within a given time frame. However, no increase of the spatial resolution can be achieved by such manipulation of the data. It would be desirable to be able to zoom during the acquisition of data. Such zooming would increase the resolution of the portion of the image focused upon in a natural manner.

A prior art problem encountered when zooming during the acquisition of data is that "aliasing" artifacts caused by undersampling may be generated unless the number of encoding cycles is increased with a proportional increase of the total acquisition time. The relationships between the field of view, the resolution and the data acquisition time are shown as follows:

The size of the volumetric aquisition matrix is:

$$n_x \cdot n_y \cdot n_z$$

where $n_x$, $n_y$ and $n_z$ denote the size of the matrix along the X, Y and Z axis, respectively.

The volume of a voxel is $$V = l_x \cdot l_y \cdot l_z$$

where $l_x$, $l_y$ and $l_z$ are the dimension along the X, Y and Z axis, respectively.

The field of view FOV is $FOV_i = l_i * n_i$ where $i = x, y, z$.

The resolution $L_i$ at voxel $n_i$ is:

$$L_i = n_i / FOV_i$$

The data acquisition time Ta is:
$Ta = TR \cdot n_x \cdot n_y$ (assuming phase encoding along the X and Y axes),
where TR is the repetition time It is apparent that restricting the FOV increases the resolution with a fixed acquisition matrix. Similarily restricting the FOV with a fixed resolution will decrease the acquisition time.

Localization of the volume of interest is important for medical diagnostic application of MRI. Selection of a cubic volume can be achieved by application of RF pulse sequences comprising three consecutive tailored RF pulses, each in the presence of a different one of the three orthogonal gradients. The use of such pulse sequences such as 90 degrees, 180 degrees and 180 degrees has been reported by R. E. Gordon and R. J. Ordidge, in a report entitled "Volume Selection for High Resolution NMR Studes" in the Proceedings of the SMRM Third Annual Meeting, 1984 at pp 272 et seq. A pulse sequence using a composite pulse such as selective 45 degrees, non-selective 90 degrees and selective 45 degrees with the composite pulse applied three times has been reported in an article by W. P. Aue, S. Muller et al in the Journal of Magnetic Resonance, vol 56 pp 350 et seq. "A Selective Volume Method for Performing Localized NMR Spectroscopy", is the subject of the U.S. Pat. No. 4,480,228 which was issued on Oct. 30, 1984.

The 90-180-180 prior art pulse sequence procedure for spatially localizing the NMR signals received yields signals that are strongly dependent on the T2 relaxation times of the spins that provide the signals. This dependance on the T2 relaxation times makes it difficult to detect signals with short T2 relaxation times.

Another problem with the prior art pulse sequence methods for spatially localizing the acquired signals is that the RF power transmitted to acquire data tends to heat the tissue of the subject. It is therefore incumbent on the designers of such methods to minimize the RF power deposition.

Yet another problem caused by the employment of 180 degree RF pulses to spatially localize time acquired signals is that there is some loss of definition in the selected volume.

The ability to obtain stimulated echoes as previously noted has been known to those skilled in the art for a long time. It is also known that among the benefits obtained by using stimulated echoes, in NMR imaging for example, is that no 180 degree pulses are needed. The 180 degree pulses, therefore, when acquiring data using stimulated echoes, the applied power is considerably reduced as compared to the spin echo data acquisition sequences where 180 degree pulses are used.

In an article entitled "Stimulated Echo Imaging" by J. Frahm, et al which appeared in the Journal of Magnetic Resonance, Vol. 64, pp 81–93, (1985) it was noted that stimulated echo imaging reduce dependence on T2 relaxation time and that the RF power requirements are reduced. It is well known that the stimulated echo procedure gives rise to a number of unwanted FIDs and echoes and until now nobody has applied stimulated echo pulse sequences for acquiring imaging data of spatially localized volumes.

BRIEF DESCRIPTION OF THE INVENTION

Accordingly it is an object of the present invention to obtain MR images from restricted volumes by means of spatially localized signals, using pulse sequences for generating stimulated echoes. More particularly, according to the present invention a method for performing restricted volume MRI is provided, said method comprises the steps of:

aligning spins in a sample by positioning said sample in a homogeneous static magnetic field for obtaining NMR derived data from the sample, irradiating said sample with a first radio frequency (RF) pulse in the presence of a first magnetic gradient so as to rotate the aligned spins in a planar slice of said sample, applying a second RF pulse in the presence of a second magnetic gradient normal to said first magnetic gradient so as to further rotate said rotated spins in a first strip of said planar slice, applying a third RF pulse in the presence of a third magnetic gradient normal to said first and second magnetic gradients to still further rotate the further rotated spins of said first strip of said slice, in a second strip, applying rephasing gradient pulses to compensate for unwanted gradient pulse caused dephasing; after the first gradient pulse or after the third gradient pulses or applying a dephasing gradient pulse prior to the second gradient pulse, and selecting said first, second and third RF pulses to generate stimulated echoes from said still further rotated spins.

A feature of the present invention includes utilization of 90 degree selective pulses, for obtaining the stimulated echoes.

A related feature of the invention eliminates or at least minimizes unwanted FIDs and echoes.

A further feature of the invention utilizes a second gradient that extends part the RF pulse in order to destroy coherence or applies spoiler gradients in the time interval between the second and third RF pulses. These gradients may applied along the X and/or Y and/or Z axes.

Yet another feature of the invention includes the application of an extra gradient pulse along the viewing axis after the application of the first RF pulse. Still another feature of the invention includes the application of one encoding gradient if a two dimensional projection of the three dimensional slice is to be imaged and two encoding gradients along two axes if a three dimensional image is desired.

Still another feature of the invention includes applying the encoding gradient or gradients and/or applying the dephasing gradient along the viewing axis between the first and second RF pulses or between the third RF pulse and the viewing gradient pulse.

A further feature of the invention provides for the cancellation of unwanted transverse magnetization. The cancellation is preferrably accomplished by applying the stimulated echo sequence at least twice, in the second application the phase of the first RF pulse is inverted and the acquired signal is subtracted from the acquired in the first application.

Yet another feature of the invention is that both the position and the size of the volume can be readily selected by appropriate choice of frequency and/or bandwidth of the three RF pulses along with controlling the strength of the selection gradients. The choice is made according to the following equations:

slice position $x = 2\pi \Delta f / Gx$; and slice width $x = 2\pi \Delta F / Gx$ where: x is the location along the X axis, as an example, (could also be the Y or Z axis);

Δf is an offset frequency (added to the Larmor frequency); and

ΔF is the bandwidth of the RF pulse.

Another feature of the invention is that the stimulated echo procedure enables the simultaneous acquisition of data from multiple localized volumes, using methods such as disclosed in U.S. patent application No. 892,063 filed on Aug. 1, 1986.

BRIEF DESCRIPTION OF THE DRAWINGS

The above mentioned and other features and objects of the present invention will be best understood when considered in the light of the following description made in conjunction with the accompanying drawings, wherein:

FIG. 3 is a showing of the RF pulse sequence used to obtain the imaging data from a restricted volume according to the invention.

General Description

Figure 1:
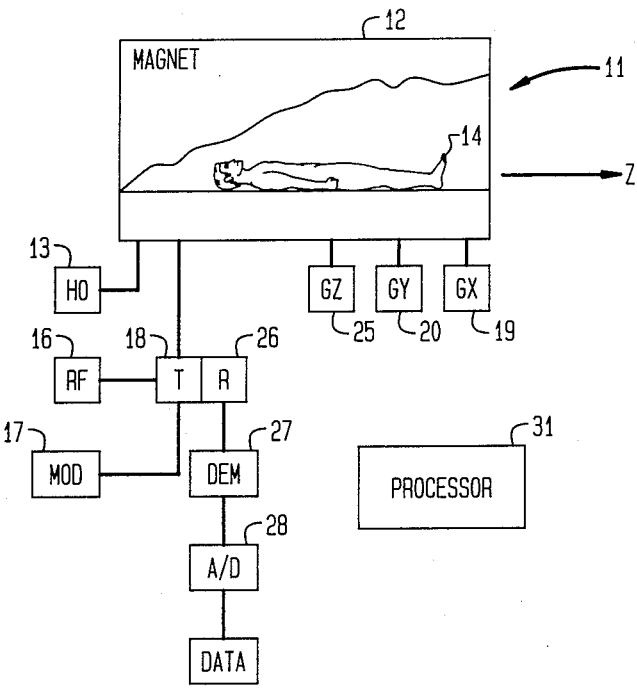
FIG. 1 is a block diagram showing of a typical NMR spectroscopic data, acquisition system.

FIG. 1 at 11 shows in block diagram form an in vivo magnetic resonant data acquisition system. The system includes a magnet 12 for generating a large static magnetic field. The magnet is sufficiently large to have a bore into which a patient 14 can fit. The patient is positioned and the magnetic field is generated by a magnetic field generator indicated at 13 by block Ho. The RF magnetic pulses are generated utilizing RF generator 16. The pulses are shaped using modulator 17. The shape of the pulses could be Gaussian or Sinc, for example. Shaped pulses in the presence of a selective gradient act to restrict the area of the sample effected by the RF pulse.

Figure 2:
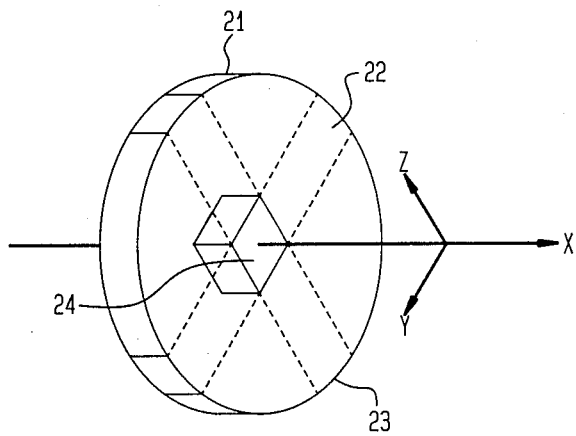
FIG. 2 is a pictorial showing a selected volume in a selected slice of a sample.

The modulated RF pulse is transmitted onto coils in the magnet not shown, The coils could also be surface coils or head coils, within the scope of this invention. The RF pulses are applied in the presence of gradients such as X gradients generated by gradient generator 19. The first RF pulse P1 transmitted by the transmitter 18 in the presence of the gradient pulse 32 (FIG. 3) selects a planar section 21 for imaging from the patient 14 as shown in FIG. 2.

At a specified time, say t1, after the application of the first RF pulse the second RF pulse P2 is applied. The second RF pulse is preferrably also shaped. It too is applied in the presence of a magnetic field gradient 33 generated by gradient generator 20. However, the magnetic gradient now is in the Y direction and causes a strip 22 in the planar section 21 to be excited. The first RF pulse nutates aligned spins in the planar section 21. The second RF pulse further nutates the nutated spins of planar section 21 that are located in the strip 22.

At a time such as time t2 for example, after the application of the second RF pulse, a third RF pulse P3 is applied. The pulse is preferrably also shaped. The third pulse is applied in the presence of a Z gradient pulse 34, generated by the gradient generator 25. The third RF pulse in the presence of the Z gradient excites the spins in a second strip indicated as 23. The excitation of the spins in the second strip still further excites the spins of the strip 22 that are intercepted by and located in strip 23. Thus the junction of strip 22 and 23 of planar section 21 actually defines a volume 24 from which stimulated echo signals are received. Each of the applied RF pulses are substantially 90 degree pulses. In practice the 90 degree pulses can vary by as much as 30 percent without a significant loss of received signal intensity. Accordingly the 90 degree pulse is herein only a nominal designation.

The received signals are detected by receiver coils in the magnet which are not shown. The receiver coils and the transmitter coils may be the same. The received signal is demodulated by demodulator 27. The demodulated signal is amplified and processed in the analog to digital processing unit 28 to provide imaging data as indicated at 29. The entire process is monitored and controlled by the processor 31.

The pulse sequence is more clearly indicated in FIG. 3. Therein, the first shaped RF pulse P1 is shown as being applied in the presence of an X gradient 32. This pulse causes the excitation and 90 degree nutation of the spins in the slice 21. The slice is along the X axis.

After a time t1, the second RF shaped pulse P2 is applied. In a preferred embodiment it is of sufficient time magnitude to nutate the RF spins in the sample by 90 degrees. The pulse P2 is applied in the presence of a Y gradient 33 to accordingly select the strip 22 in the patient.

At a time t2 after the application of the pulse P2, a third shaped RF pulse P3 is applied, in the presence of the Z gradient 34 to excite the spins in the planar section 23. The application of the three RF pulses and the three gradients as described selects the volume 24. The size and location of the volume is controlled by the processor 31 which controls the strength of the gradient and the amplitude, duration and frequency of the pulses. At a time t3 after the application of pulse P3, the stimulated echo signals such as signal 35 are received in the presence of a view gradient 36. It is noted that the order of the application of the gradient pulses is not critical. Thus the axes are basically interchangeable.

In a preferred embodiment, the first gradient GX pulse 32 as shown in FIG. 3 has a negative portion 37 applied after the first RF pulse terminates. The negative portion extends for about half of the area of the positive portion of the first gradient pulse and is used for refocusing the spins. In a similiar manner the pulse 33 has a negative portion 38 applied prior to the application the pulse P2 in the presence of pulse 33. The area of the negative portion is about one half the area of the positive portion.

Note that the third gradient pulse also has a negative portion 39 that is applied after the termination of the third RF pulse. The negative portion extends for approximately half of the time period of the positive portion of the same pulse.

Spoiler gradient pulses or dephasing gradient pulses 40–42 are shown as applied in the time interval t2 between the second and third RF pulses in order to destroy coherence. Unwanted transverse magnetization created by the third 90 degree pulse from the regions outside the volume of interest as well as spurious echoes are cancelled by a repetition of the sequence of FIG. 3 in which the repeated sequence uses a first pulse of 90 degree that is inverted relative to the first pulse of the first sequence. The acquired signal is then subtracted from that acquired using the first scan sequence.

A dephasing gradient 43 along the view axis (X in the example) is applied between RF pulse P1 and P2 to control the location of the echo signals. It insures that the stimulated echo appears during the sampling time indicated by 44 on the receiver axis of FIG. 3. A phase encoding gradient is indicated in FIG. 3 as being applied between pulses P1 and P2 along the Z axis. A single phase encoding gradient results in a two dimensional projection image of the selected volume. The application of a second phase encoding gradient, shown as gradient 46, results in a three dimensional image of the selected volume. Note that gradients 43, 45 or 46 can be applied between pulses P3 and the view gradient 36. If gradient 43 is so applied it must be inverted.

The sequences described above yield spatially localized signals from a single volume 24. To improve the efficiency of the sequences they may be slightly modified to produce localized signals from multiple volumes; this can be achieved without increasing the measurement time by exploiting the waiting time during the repetition time interval.

One method to implement the "multivolume mode" involves application of the RF pulse P3 (and the sampling 44 that follows) n times, with varying offset frequences, to excite n distinct volumes along the axis used for slice selection in conjunction with RF pulse P3 (e.g. along the Z-axis in FIG. 3). This method takes advantage of the fact that after the application of P2, the relevant magnetization, namely from the strip at the intersection of the slices excited by P1 and P2, is stored parallel to the large static field. Consequently it's return to equilibruim is governed by the (longer) spin-lattice relaxation time and thus persists longer.

Another method to implement the "multivolume mode" is by application of the full sequence a plurality of times during the repetition time interval, each repetition chooses a different volume anywhere within the organ under study. The only restriction, to avoid signal saturation, is that no two volumes share a common plane.

Thus a system is provided for acquiring volume restricted imaging data in which the dependence on T2 relaxation time is reduced. The RF power applied during the designated sequence is much lower than that necessitated in the use of the normal spin echo sequence employing 180 degree pulses. The technique described above provides for unique spatial localization for MRI and also provides a predominant T1 contrast in the image as compared to the predominant T2 contrast of the spin echo images.

While the foregoing invention has been described using preferred embodiments, it should be understood that the preferred embodiment are shown by way of example only and not as limitations on the scope of the invention.

What is claimed is:

1. A method for performing restricted volume magnetic resonance (MR) imaging comprising the steps of:
   aligning spins in a subject by positioning the subject in a strong static magnetic field,
   irradiating said subject with a first RF pulse in the presence of a first magnetic gradient so as to nutate the aligned spins in a first selected volume of said subject,
   irradiating said subject with a second RF pulse in the presence of a second magnetic gradient normal to said first magnetic gradient so as to further nutate the nutated spins in a portion of said first selected volume of said subject,
   irradiating said subject with a third RF pulse in the presence of a third magnetic gradient normal to said first and second magnetic gradients to still further nutate the further nutated spins in a section of said portion of said first selected volume, to thereby select a particular volume of the subject,
   selecting said first, second and third RF pulses to generate stimulated echo signals from said still further nutated spins at a time after the third RF pulse equal to the time between said first and said second RF pulses,
   applying encoding gradient pulses to provide image data, and
   sampling the stimulated echo signals for use as the image data in presence of a view gradient pulse.

2. The method of claim 1 wherein each of said first, second and third magnetic gradients are along first, second and third axes of a Cartesian coordinate system and wherein the step of applying encoding gradient pulses comprises applying said encoding gradient pulses along one of said axes to obtain a two dimensional projection image.

3. The method of claim 1 wherein each of said first, second, and third magnetic gradients are along first, second, and third axes of a Cartesian coordinate system and wherein the step of applying encoding gradient pulses comprises applying said encoding gradient pulses along two of said axes to obtain a three dimensional image.

4. The method of claim 1 wherein the first, second and third RF pulses are nominal 90 degree pulses.

5. The method of claim 1 wherein said pulses are shaped pulses.

6. The method claim 1 including the step of applying rephasing gradient pulses to compensate for unwanted selection gradient pulse dephasing.

7. The method claim 6 wherein one of said dephasing gradient pulses is a negative pulse applied between the first and the second RF pulses along the same axis as the axis of the selection gradient pulse for the first RF pulse.

8. The method of claim 6 wherein one of the rephasing gradient pulses is a negative pulse applied after the second RF pulse along the same axis as the axis of the selection gradient pulse for the second RF pulse.

9. The method claim 6 wherein one of said dephasing gradient pulses is a negative pulse applied after the third RF pulse along the same axis as the axis of the selection gradient pulse for the third RF pulse.

10. The method of claim 1 including the step of applying an extra gradient pulse along the same axis as the view gradient pulse to assure that the stimulated echo signals occur within the span of the view gradient pulse.

11. The method of claim 1 including the step of applying spoiler gradients in the time interval between the second and third RF pulses.

12. The method of claim 1 including the step of extending said second magnetic gradient beyond the second RF pulse to destroy coherence.

13. The method of claim 1 including the steps of:
    applying the stimulated echo sequence at least twice,
    inverting the phase of the first RF pulse for the second application of the sequence, and
    subtracting the signal acquired using the inverted phase from the signal acquired with the non-inverted phase.

14. The method of claim 1 and selecting the positions and the sizes of the selected volumes.

15. The method of claim 1 including the steps of:
    selecting the position of each of the selected volumes by selecting the frequency of the RF pulses;
    selecting the sizes of each of the selected volumes by selecting the bandwidth of the RF pulses, and selecting the amplitudes of the field gradients.

16. The method of claim 1 including the step of simultaneously acquiring signals from multiple localized volumes.

17. The method of claim 1 wherein said encoding gradient pulses are applied between said first and second RF pulses.

18. The method of claim 1 wherein said encoding gradient pulses are applied after said third RF pulse.

19. The method of claim 16 wherein said step of simultaneously acquiring signals from multiple localized volumes comprises applying a series of third RF pulses.

20. The method of claim 16 wherein said step of simultaneously acquiring signals from multiple localized volumes comprises applying the steps of selecting a localized volume a number of times during the repetition time of a scan but choosing a different volume each time with all of the chosen volumes having independant planes different than the planes of the other volumes.

* * * * *